(12) United States Patent
Miyamoto et al.

(10) Patent No.: US 7,764,513 B2
(45) Date of Patent: Jul. 27, 2010

(54) HIGH FREQUENCY TUNER MODULE

(75) Inventors: Shozo Miyamoto, Katagami (JP);
Makoto Abe, Katagami (JP)

(73) Assignee: Mitsumi Electric Co., Ltd., Tama-Shi (JP)

( * ) Notice: Subject to any disclaimer, the term of this patent is extended or adjusted under 35 U.S.C. 154(b) by 0 days.

(21) Appl. No.: 12/004,230

(22) Filed: Dec. 20, 2007

(65) Prior Publication Data

US 2008/0174984 A1    Jul. 24, 2008

(30) Foreign Application Priority Data

Jan. 24, 2007    (JP) .............................. 2007-013471

(51) Int. Cl.
*H05K 9/00* (2006.01)
(52) U.S. Cl. ..................... 361/816; 361/800; 361/818; 361/814; 174/350
(58) Field of Classification Search .............. 361/800, 361/816, 818; 174/350, 377
See application file for complete search history.

(56) References Cited

U.S. PATENT DOCUMENTS

| | | | | |
|---|---|---|---|---|
| 5,089,794 A | * | 2/1992 | Norimatsu | 331/68 |
| 5,172,077 A | * | 12/1992 | Funada | 331/67 |
| 5,355,016 A | * | 10/1994 | Swirbel et al. | 257/659 |
| 5,838,551 A | * | 11/1998 | Chan | 361/818 |
| 5,898,344 A | * | 4/1999 | Hayashi | 331/67 |
| 6,118,347 A | * | 9/2000 | Ohira | 331/68 |
| 6,144,557 A | * | 11/2000 | Chen et al. | 361/704 |
| 6,796,484 B2 | * | 9/2004 | Wittebrood et al. | 228/249 |
| 6,826,053 B2 | * | 11/2004 | Kato et al. | 361/715 |
| 6,834,791 B2 | * | 12/2004 | Seidler | 228/255 |
| 7,145,084 B1 | * | 12/2006 | Sarihan et al. | 174/361 |
| 7,170,014 B1 | * | 1/2007 | Liang | 174/383 |
| 7,190,982 B2 | * | 3/2007 | Yamamoto et al. | 455/575.1 |
| 7,297,370 B2 | * | 11/2007 | Vallance et al. | 427/372.2 |
| 2001/0053070 A1 | * | 12/2001 | Kitamura et al. | 361/818 |
| 2008/0137319 A1 | * | 6/2008 | Bobrowski et al. | 361/816 |

FOREIGN PATENT DOCUMENTS

| | | |
|---|---|---|
| JP | 5-327230 A | 12/1993 |
| JP | 2006-101467 A | 4/2006 |

* cited by examiner

*Primary Examiner*—Dameon E Levi
(74) *Attorney, Agent, or Firm*—Frishauf, Holtz, Goodman & Chick, P.C.

(57) ABSTRACT

Disclosed is a high frequency wave tuner module including a circuit board having an approximately rectangular shape, which is made of ceramic material and a shield cover to shield an interfering wave by covering a circuit part mounted on a board surface of the circuit board, and a position of the shield cover in a height direction with respect to the board surface is determined by fixing the shield cover to the board surface at four corner positions of the circuit board, and a position of the shield cover in a board surface direction with respect to the circuit board is determined by engaging at least two side walls of the shield cover which extend in a thickness direction of the circuit board, with end surfaces of the circuit board, which correspond to the two side walls.

2 Claims, 6 Drawing Sheets

HIGH FREQUENCY TUNER MODULE

BACKGROUND OF THE INVENTION

1. Field of the Invention

The present invention relates to a high frequency wave tuner module, and particularly to a high frequency wave tuner module which is provided with a shield cover to shield the interfering wave from outside.

2. Description of Related Art

In high frequency wave tuner module for receiving the signal of high frequency band such as the television tuner for the terrestrial digital broadcasting, the tuner for wireless LAN or a tuner for satellite radio or the like which is in used in the U.S., the module is structure by disposing the wiring patters such as the signal wire, the GND wire and the like and the circuit parts on both surfaces or on one surface of the single layer circuit board. Further, in recent years, a multiple-layer board which is formed by layering a plurality of boards is used as the circuit board for downsizing and thinning of the tuner module and improvement of the component mounting density of the tuner module (for example, JP5-327230A).

Moreover, in many cases, a shield cover for covering the board surface of the circuit board to shield the interfering wave from outside is provided in such circuit boards (for example, JP2006-101467A). Further, the GND of the circuit board is assured by connecting the shield cover with the GND of the board by soldering or the like.

In the manufacturing of the high frequency wave tuner module, the shield cover is attached to the circuit board as described in the above mentioned JP2006-101467A. Here, for example, the notches 102 are provided on the circuit board 101 as shown in FIG. 4A and the convex portions 105 are provided on the side walls 104 of the shield cover 103 at the positions corresponding to the above mentioned notches 102 as shown in FIG. 4B in order to correctly decide the position of the shield cover with respect to the circuit board.

As shown in FIG. 5, the position of the shield cover 103 is determined with respect to the circuit board 101 by inserting the convex portions 105 of the shield cover 103 in the notches 102 of the circuit board 101, and the four corners of the shield cover 103 are connected and fixed to the circuit board 101 by soldering or the like in a state where the four corners of the shield cover 103 are in contact with the circuit board 101 to form the high frequency wave tuner module 100.

The circuit board is usually manufactured by cutting one large board. When the notches are to be provided on the circuit board as described above, conventionally, the holes 107 which become the above mentioned notches 102 and the holes 108 which corresponds to the cut off portions of the four corners of the circuit board are perforated in the one large board 106 in advance as shown in FIG. 6, and the circuit boards having the notches are manufactured by cutting the board. Further, there is a case where the notches are formed after the circuit boards are cut out from the one large board.

However, there is a case where the low-temperature conferred ceramic (LTCC) having alumina as the base material is used for the single layer or the multiple-layer circuit board which is used for the high frequency wave tuner module. The ceramic material such as the low-temperature conferred ceramic is usually hard and the process of perforating the holes 107 and 108 in the board 106 and the process of forming the notches by scraping the circuit board as shown in FIG. 6 are not necessarily easy processes. The process of perforating a hole is easy before calcining because the material is soft. However, an accuracy of the size after calcining is hard to acquire. Further, the number of the processes increases because the process such as perforating holes in a large board or the like is needed, and the improvement of the productivity of the circuit board is prevented.

Moreover, when the convex portions of the shield cover are inserted in the notches of the circuit board, the circuit parts cannot be mounted on the portion 101a outside of the side walls 104 of the shield cover 103 within the circuit board 101 as shown in the high frequency wave tuner module 100 of FIG. 5, and the area on the circuit board 101 in which the circuit parts can be mounted is reduced. In contrary, when attempting to assure the area for mounting the circuit parts, the circuit board 101 needs to be made larger for the portion of the above mentioned outside portion 101a. Therefore, there is a problem that the downsizing of the high frequency wave tuner module is prevented.

SUMMARY OF THE INVENTION

In view of the above problems, a main object of the present invention is to provide a high frequency wave tuner module which can assure the area on the circuit board for mounting the circuit parts and which can improve the productivity.

According to a first aspect of the present invention, there is provided a high frequency wave tuner module comprising a circuit board having an approximately rectangular shape, which is made of ceramic material and a shield cover to shield an interfering wave by covering a circuit part mounted on a board surface of the circuit board, and a position of the shield cover in a height direction with respect to the board surface is determined by fixing the shield cover to the board surface at four corner positions of the circuit board, and a position of the shield cover in a board surface direction with respect to the circuit board is determined by engaging at least two side walls of the shield cover which extend in a thickness direction of the circuit board, with end surfaces of the circuit board, which correspond to the two side walls.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein:

FIGS. 1A and 1B are diagrams showing a structure of a high frequency wave tuner module according to the present invention, wherein FIG. 1A is a perspective view and FIG. 1B is a side view;

DETAILED DESCRIPTION OF PREFERRED EMBODIMENT

Hereinafter, the embodiment of the high frequency wave tuner module according to the invention will be described with reference to the drawings.

In the embodiment, a description will be given for a case where the circuit board of the high frequency wave tuner module is formed in a single layer. However, the present invention is not limited to the case where the circuit board is single layer, and the same description applies for the case where the circuit board is a multi-layer board.

Figure 1A:
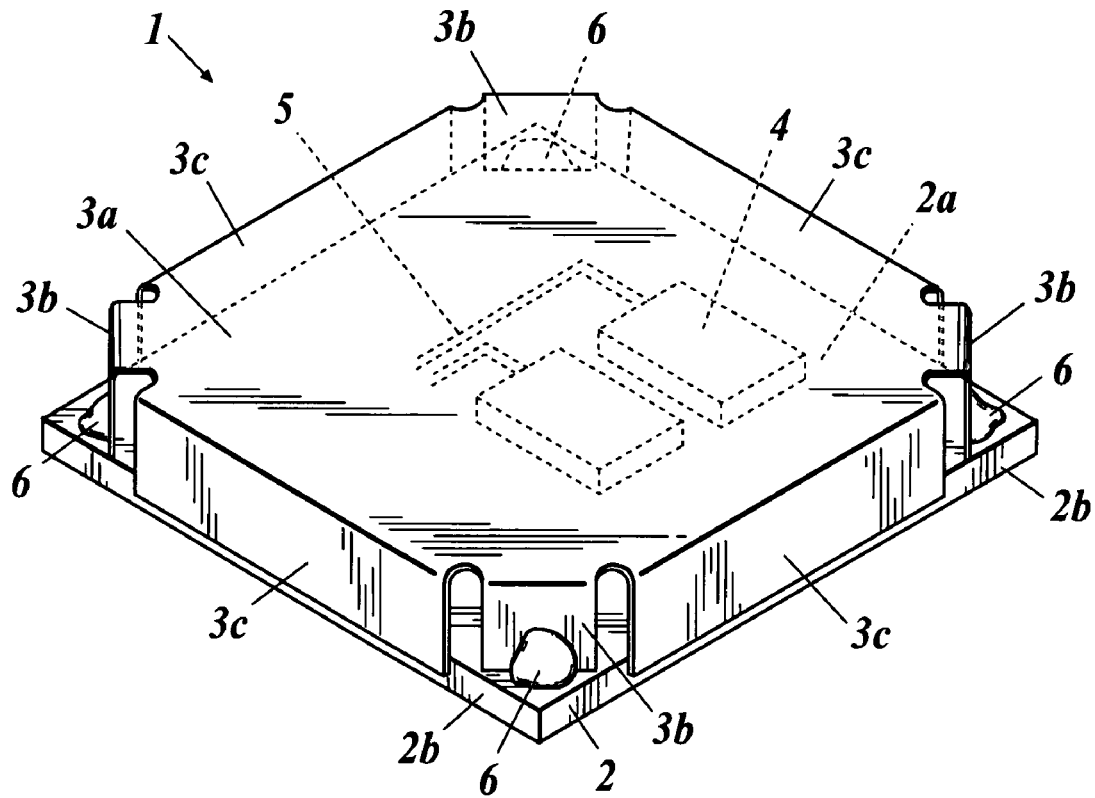
Figure 1B:
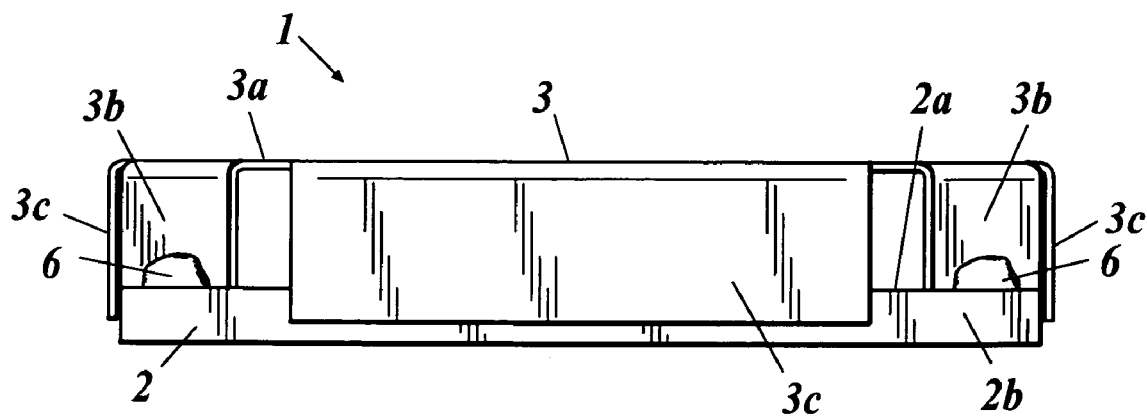

As shown in the perspective view of FIG. 1A and in the side view of FIG. 1B, the high frequency wave tuner module 1 of the embodiment comprises a circuit boar 2 and a shield cover 3. Here, in the embodiment, the input and output of the signal to and from the high frequency wave tuner module 1 is carries out via external terminal electrodes (omitted from the drawing) which are formed on one surface of the circuit boar 2.

The circuit board 2 is formed with low-temperature conferred ceramic member, and is formed in a square form in the embodiment. Further, various types of circuit parts 4 and wiring 5 such as a signal wire, the GND wire and the like are mounted on the board surface 2a of the circuit board 2, that is on the surface which is the other side of the surface on which the above mentioned external terminal electrodes are provided.

Figure 4A:
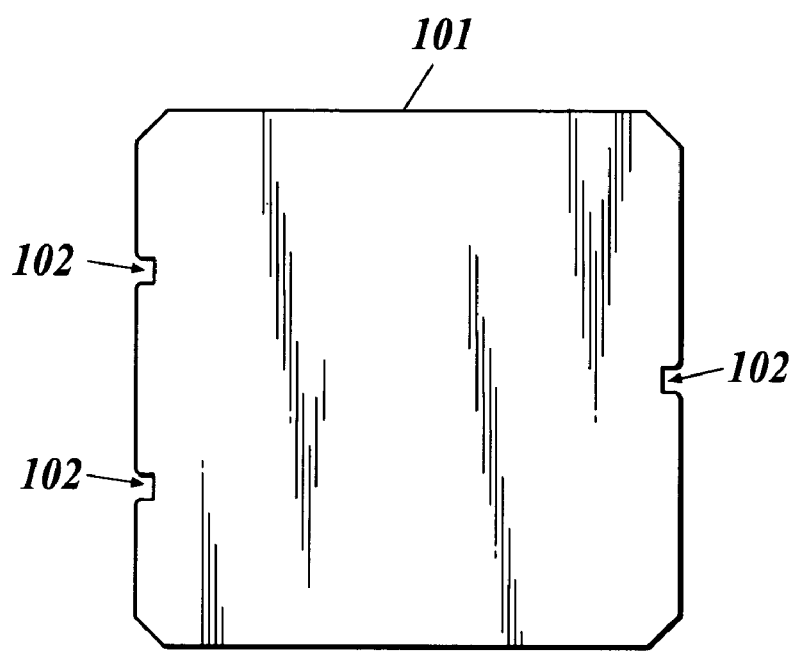
FIG. 4A is a diagram showing a circuit board in which notches are provided.
Figure 5:
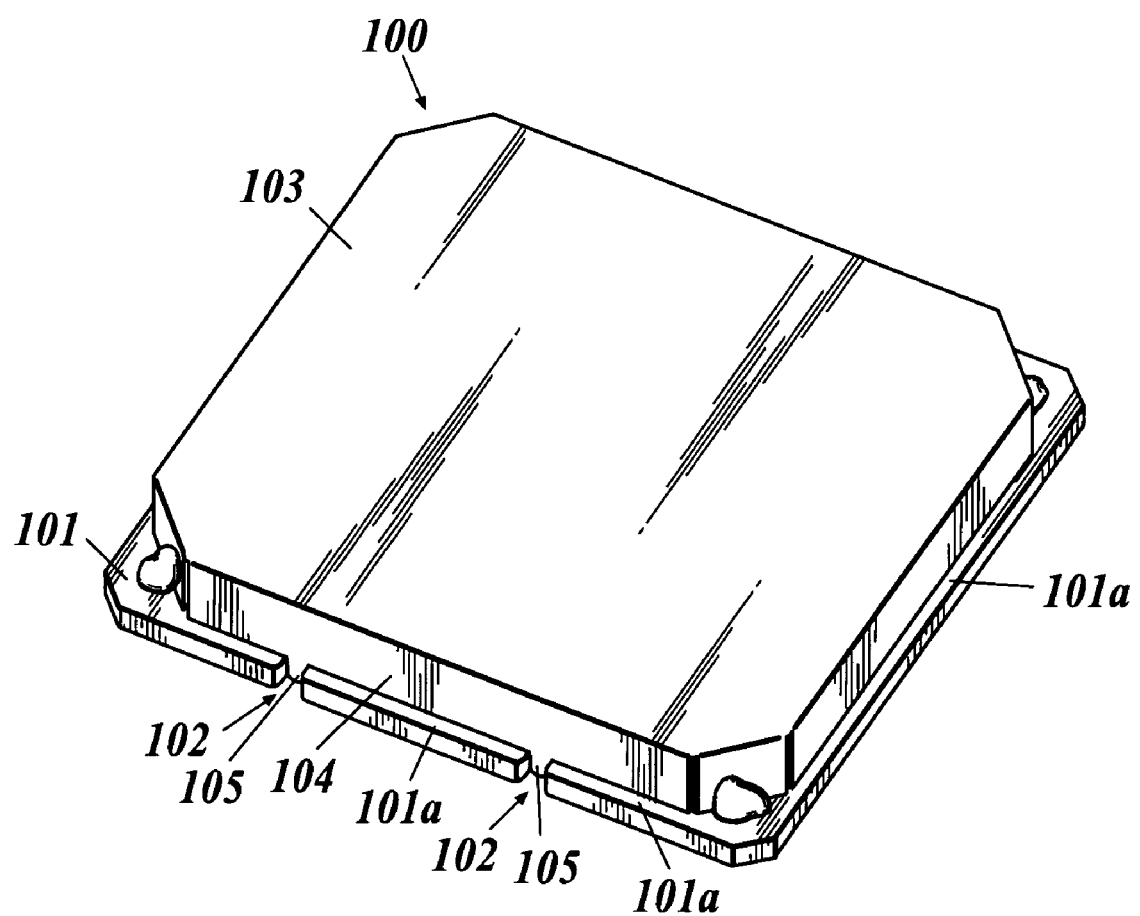
FIG. 5 is a perspective view showing the high frequency wave tuner module which is formed by inserting the convex portions in the notches.
Figure 6:
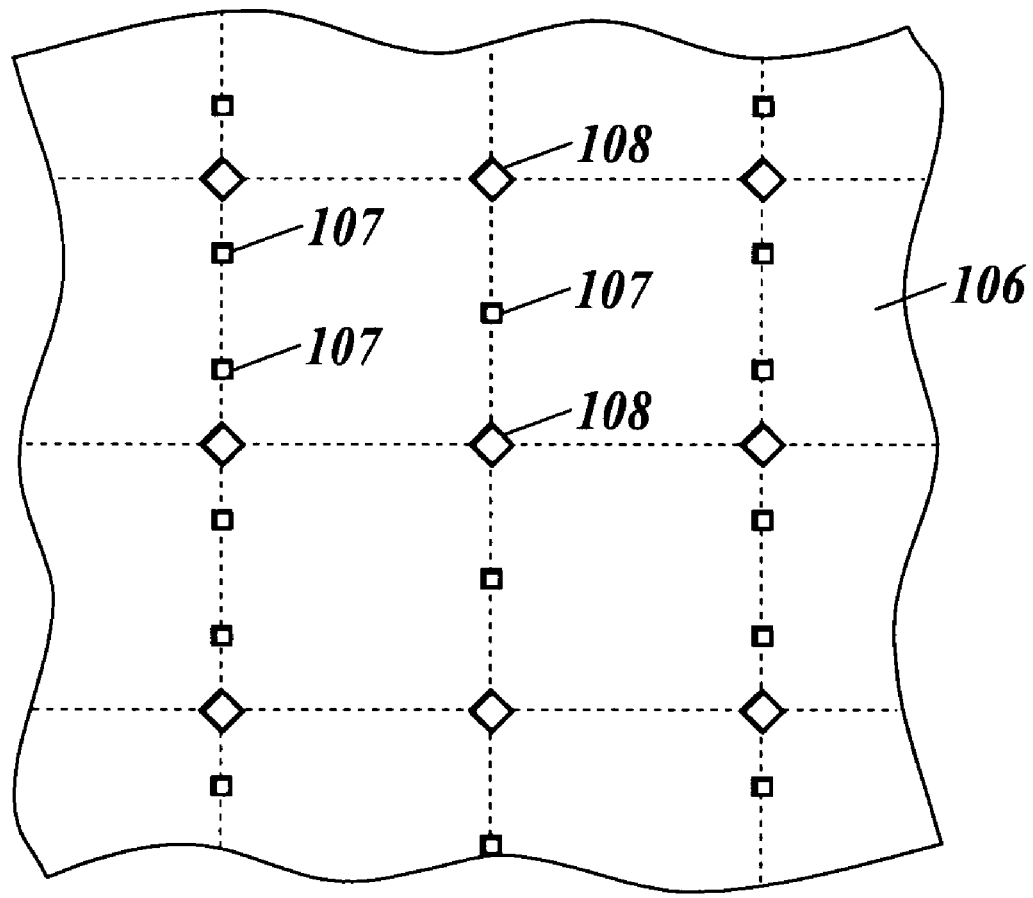
FIG. 6 is a diagram showing a board in which holes are perforated.

Moreover, in the embodiment, the notches shown in the conventional example of FIGS. 4A and 5 are not formed on the end surface 2b of the circuit board 2, and each of the four end surfaces 2b is formed in an elongated planar shape so as to be orthogonal to the board surface 2a.

The shield cover 3 is formed with metallic member, and shields the interfering wave from outside by covering the circuit parts 4 and the like which are mounted on the board surface 2a of the circuit board 2. In the embodiment, the shield cover 3 is formed by a metallic thin plate being bent in an approximately case shape, and the base surface 3a of the shield cover 3 is disposed so as to be parallel to the board surface 2a of the circuit board 2.

Further, the tip portions of the four side walls 3b (hereinafter, called the corner part side walls 3b) of the shield cover 3 contact the four corner-portions of the rectangular shaped circuit board 2. The position of the shield cover 3 in the high direction with respect to the board surface 2a of the circuit board 2 is determined by the four corner part side walls 3b being fixed to the circuit board 2 at the above mentioned positions. That is, the length of the corner part side walls 3b determines the height of the base surface 3a of the shield cover 3 with respect to the board surface 2a of the circuit board 2.

In the embodiment, the GND wires (omitted from the drawing) are arranged at the four corner portions of the circuit board 2. By the corner part side walls 3b of the shield cover 3 being fixed to the GND wires by soldering 6, the position of the shield cover 3 is determined and the shield cover 3 is electrically connected with the GND of the circuit board 2. Here, the shield cover 3 and the GND can be connected and be fixed by conductive resin or the like instead of the soldering 6.

Moreover, the four side walls 3c (hereinafter, called the edge part side walls 3c) of the shield cover 3 which are provided so as to correspond to the end surfaces 2b of the square shaped circuit board 2, respectively, are provided so as to extend in the sides of the end surfaces 2b of the circuit board 2 exceeding the board surface 2a of the circuit board 2, that is, so as to extend in the width direction of the circuit board 2.

That is to say, in the embodiment, the length of the edge part side walls 3c of the shield cover 3 from the base surface 3a is formed so as to be longer than the length of the corner part side walls 3b from the base surface 3a. The length of the edge part side walls 3c are adjusted within the range so that the tip portions of the edge part side walls 3c do not extend in the lower direction exceeding the back surface of the circuit board 2, that is the surface on which the external terminal electrodes are provided in the embodiment as shown in FIGS. 1A and 1B in a state where the shield cover 3 is fixed to the circuit board 2 via the corner part side walls 3b.

The four edge part side walls 3c of the shield cover 3 contact the four end surfaces 2b of the circuit board 2 from the side, respectively, and each of the edge part side walls 3c engages with the corresponding end surface 2b of the circuit board 2 so as to fit to determined the position of the shield cover 3 in the board surface direction with respect to the circuit board 2.

Next, the effect of the manufacturing process of the high frequency wave tuner module 1 according to the embodiment will be described by showing the manufacturing process.

First, the circuit board 2 of the high frequency wave tuner module 1 is formed by cutting a large low-temperature conferred ceramic member board (omitted from the drawing). Here, the low-temperature conferred ceramic member board is merely cut in necessary shapes in the embodiment, and the operation such as perforating holes in the board or forming notches and the like on the end surfaces 2b of the circuit board 2 which is formed by cutting the board as in the above mentioned conventional example is not carried out.

The wiring patter is formed on the board surface 2a or the like of the circuit board 2, and the circuit board 2 is completed by having the needed circuit parts 4 disposed and by connecting with the wiring 5.

Figure 2:
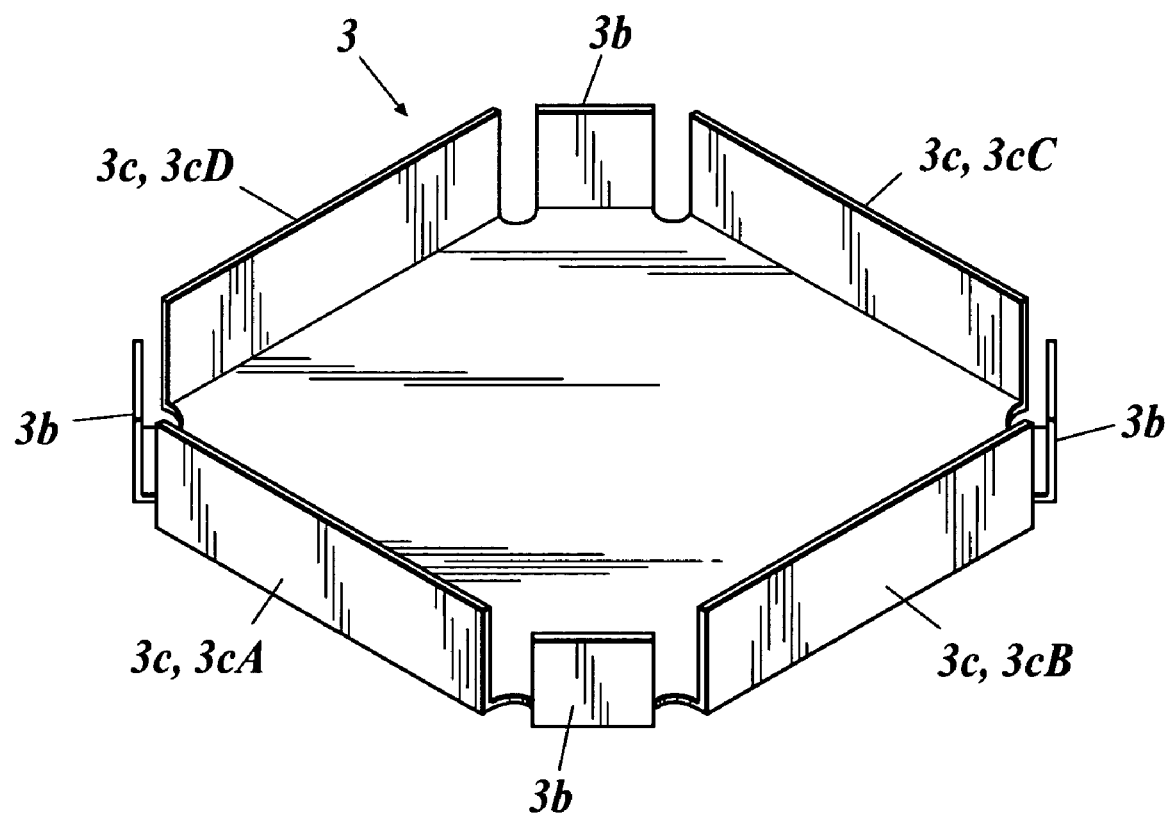
FIG. 2 is a perspective view showing a structure of a shield cover.

Meanwhile, the shield cover 3 shown in FIG. 2 is formed by punching or the like from a metallic thin plate. Here, the four edge part side walls 3c is formed so as to be longer than the corner part side walls 3b as described above in the embodiment. Then, the shield cover 3 which is formed by the process described above is put over the circuit board 2 so as to cover the circuit parts 4 from the upper direction of the board surface 2a of the circuit board 2.

Then, the four edge part side walls 3c of the shield cover 3 contact the four end surfaces 2b of the circuit board 2 from the side, respectively, and are engaged with the corresponding end surfaces 2b of the circuit board 2 so as to be fitted. In such way, the position of the shield cover 3 in the board surface direction with respect to the circuit board 2 is determined.

When the shield cover 3 proximate the circuit board 2 further more, the shield cover 3 reaches the point where it cannot proximate the circuit board 2 any more by the corner part side walls 3b of the shield cover 3 contacting the four corner positions of the circuit board 2. In such way, the position of the shield cover 3 in the height direction with respect to the board surface 2a of the circuit board 2 is determined.

Then, the corner part side walls 3b of the shield cover 3 are soldered to the GND wires which are arranged in the four corners of the circuit board 2 to fix the shield cover 3 to the circuit board 2 and to electrically connect the shield cover 3 with the GND of the circuit board 2.

As described above, according to the high frequency wave tuner module 1 of the embodiment, there is no need to perforate the holes in the original hard ceramic member board and to form the notches on the end surfaces 2*b* of the circuit board 2 in the manufacturing process of the circuit board 2. Further, the shield cover 3 can be formed easily by punching or the like. Moreover, the position of the shield cover 3 in the board surface direction and in the height direction can be automatically and surely determined just by putting the shield cover 3 over the circuit board 2.

Therefore, the high frequency wave tuner module can be manufactured very easily without increasing the number of operation processes. Thus, the productivity can be greatly improved.

Moreover, in the high frequency wave tuner module 1 of the embodiment, the area on the board surface 2*a* of the circuit board 2 in which the circuit parts 4 can be mounted is all the area except for the four corners of the circuit board 2 as shown in FIG. 1A. Further, because even the four corners can be used as the portions in which the GND wires are provided and in which the shield cover 3 and the GND are being connected as described above, the entire area on the board surface 2*a* of the circuit board 2 is practically the area in which the circuit parts 4 and the like can be mounted.

That is to say, there is no unavailing area on the circuit board 2 of the high frequency wave tuner module 1 of the embodiment, such as the portions 101*a* outside of the side walls in which the circuit parts cannot be mounted in the conventional high frequency wave tuner module 100 shown in FIG. 5. Therefore, the high frequency wave tuner module can be downsized, and at the same time the area for mounting the circuit parts 4 and the like on the circuit board 2 can be sufficiently reserved.

The high frequency wave tuner module 1 according to the present invention can be modified in various ways.

In the above described embodiment, the description is given for the case where the four edge part side walls 3*c* of the shield cover 3 are formed so as to be longer than the corner part side walls 3*b*. However, for example, the three edge part side walls 3*c*A to 3*c*C among the four edge part side walls 3*c*A to 3*c*D shown in FIG. 2 can be formed so as to be longer than the three of the corner part side walls 3*b*, and the remaining edge part side wall 3*c*D can be formed in the same length as the corner part side wall 3*b*.

In such case, when the shield cover 3 is fitted to the circuit board 2, first, the edge part side walls 3*c*A and 3*c*C of the shield cover 3 holds the end surfaces 2*b* of the circuit board 2, and then the position of the shield cover 3 can be easily determined by pressing the circuit board 2 onto the edge part side wall 3*c*B. Therefore, the corner part side walls 3*b* can be fixed to the circuit board 2 by soldering or the like.

Moreover, only two of the edge part side walls of the shield cover 3 which are orthogonal to one another, for example, the edge part side walls 3*c*A and 3*c*B, can be formed so as to be longer than the corner part side walls 3*b*, and the remaining edge part side walls 3*c*C and 3*c*D can be formed in the same length as the corner part side walls 3*b*.

In such case, when the shield cover 3 is fitted to the circuit board 2, the position of the shield cover 3 can be easily determined by pressing the end surface 2*b* of the circuit board 2 onto the edge part side walls 3*c*A and 3*c*B of the shield cover 3 which are formed so as to be longer than the corner part side walls 3*b*. Therefore, the corner part side walls 3*b* can be fixed to the circuit board 2 by soldering or the like.

Figure 3:
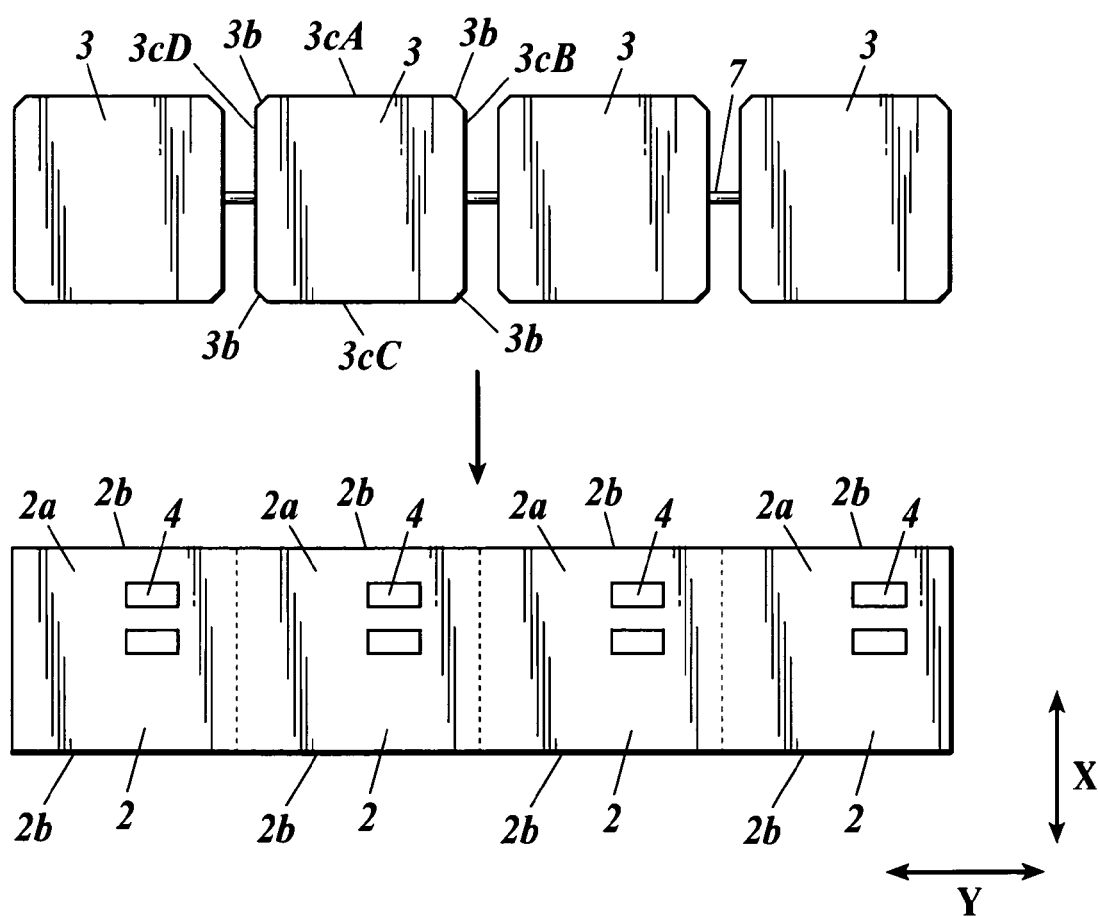
FIG. 3 is a diagram for explaining the manufacturing method of the shield covers in which a plurality of shield cover are connected and the high frequency wave tuner module.

Meanwhile, when the shield cover 3 is formed, there is a case where a plurality of shield covers 3 are connected in a strip form by the connecting pieces 7 as shown in FIG. 3. In such case, only two of the edge part side walls 3*c*A and 3*c*C of the individual shield cover 3 which face one another are to be formed so as to be longer than the corner part side walls 3*b*, and the remaining edge part side walls 3*c*B and 3*c*D are to be formed in the same length as the corner part side walls 3*b*. Here, the circuit boards 2 are formed by having a plurality of the circuit boards 2 connected, and the circuit parts 4 and the like are mounted on the board surfaces 2*a* of the circuit boards 2 in advance.

Then, when the plurality of shield cover 3 in a strip form is put over the plurality of circuit boards 2 from the upper direction of the plurality of circuit boards 2 in a strip form, the edge part side walls 3*c*A and 3*c*C of the shield cover 3 hold the end surfaces 2*b* of the circuit boards 2. Therefore, at least the shield cover 3 is restricted from moving in the width direction of the circuit board 2 which is indicated by an arrow X in the drawing, and the position of the shield cover 3 in the width direction X is determined.

The position of the shield cover 3 in the longitudinal direction of the circuit board 2 which is indicated by an arrow Y in the drawing is arbitrarily adjusted. Further, by cutting out the circuit boards 2 individually along with the connecting pieces 7 after all the corner part side walls 3*b* of the shield cover 3 are fixed to the circuit board 2 by soldering or the like, the high frequency wave tuner module can be manufactured easily and efficiently.

Figure 4B:
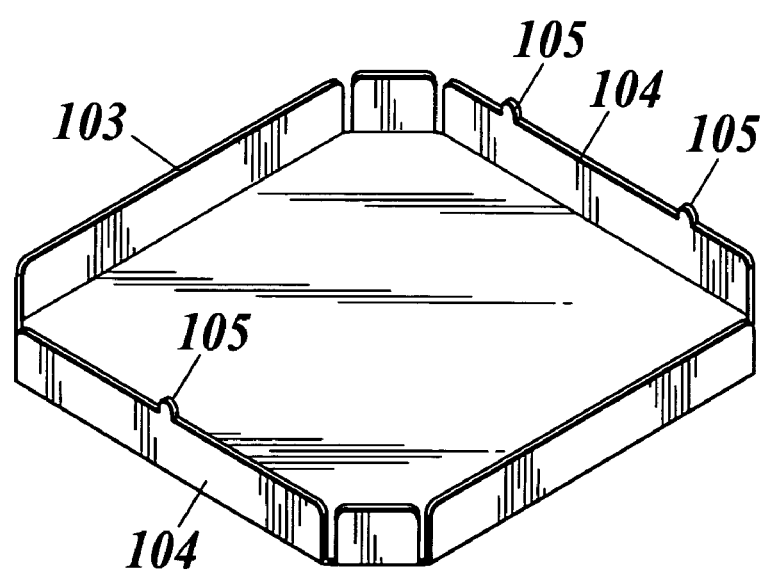
FIG. 4B is a diagram showing a shield cover in which convex portions are provided on side walls.

Here, in the above described embodiment and the modification, the notches are not provided on the end surfaces 2*b* of the circuit board 2. However, the four corner portions of the circuit board 2 can be cut off as shown in the conventional example of FIGS. 4 and 5 within the range in which the corner part side walls 3*b* can be fixed to the circuit board 2, and this cutting off of the corner parts is arbitrarily carried out.

According to a first aspect of the preferred embodiment of the present invention, there is provided a high frequency wave tuner module comprising a circuit board having an approximately rectangular shape, which is made of ceramic material and a shield cover to shield an interfering wave by covering a circuit part mounted on a board surface of the circuit board, and a position of the shield cover in a height direction with respect to the board surface is determined by fixing the shield cover to the board surface at four corner positions of the circuit board, and a position of the shield cover in a board surface direction with respect to the circuit board is determined by engaging at least two side walls of the shield cover which extend in a thickness direction of the circuit board, with end surfaces of the circuit board, which correspond to the two side walls.

In accordance with the first aspect of the preferred embodiment of the present invention, the shield cover is fixed to the board surface at the four corners of the circuit board, the position of the shield cover is automatically determined in the height direction with respect to the board surface by the shield cover being fixed to the board surface. Further, the position of the shield cover in the board surface direction with respect to the circuit board is determined by at least two side walls of the shield cover engaging with the end surfaces of the circuit board. Therefore, there is no need to provide notches for determining the position of the shield cover on the end surfaces of the circuit board as in the above mentioned conventional example. Thus, the process of perforating holes in the hard ceramic member board and the process of providing notches in the end surfaces of the circuit board are not needed in the manufacturing of the circuit board.

Moreover, the shield cover can be formed easily by punching or the like, and the position of the shield cover in the board surface direction and the height direction can be automatically determined just by putting the shield cover over the circuit board. Therefore, the high frequency wave tuner module can be manufactured very easily and without increasing the number of operation process. Thus, the productivity can be greatly improved.

Furthermore, in the high frequency wave tuner module according to the present invention, the area on the board surface of the circuit board in which the circuit parts can be mounted is the entire area except for the four corners of the circuit board as shown in FIG. 1A. Further, even the four corner portions are being used by having the GND wires provided there to allow the shield cover to have the electric potential of the GND level by connecting the GND wires with the shield cover. Therefore, the entire area on the board surface of the circuit board can practically be the area in which the circuit parts and the like can be mounted.

That is to say, there is no unavailing space on the circuit board of the high frequency wave tuner module of the present invention, such as the portions 101a outside the side walls in the convention high frequency wave tuner module in which the circuit parts cannot be mounted as shown in FIG. 5. Therefore, the high frequency wave tuner module can be downsized and also a sufficient area for mounting the circuit parts and the like can be assured on the circuit board.

Preferably, the position of the shield cover in the board surface direction with respect to the circuit board is determined by engaging four side walls of the shield cover which extend in the thickness direction of the circuit board, with the end surfaces of the circuit board, which correspond the four side walls.

The position of the shield cover with respect to the circuit board can be determined easily and correctly because the four side walls of the shield cover engage with the end surfaces of the circuit board so as to fit to the circuit board. Therefore, the same effect can be obtained more effectively and efficiently.

Preferably, the position of the shield cover in the board surface direction with respect to the circuit board is determined by engaging the two side walls of the shield cover orthogonal to one another which extend in the thickness direction of the circuit board, with the corresponding end surfaces of the circuit board.

The position of the shield cover can be determined easily because the position of the shield cover with respect to the circuit board can be determined by pressing the end surfaces of the circuit board onto two of the side walls of the shield cover which are orthogonal to one another. Therefore, the same effect can be obtained efficiently.

Preferably, the position of the shield cover in the board surface direction with respect to the circuit board is determined by engaging the two side walls of the shield cover facing one another which extend in the thickness direction of the circuit board, with the corresponding end surfaces of the circuit board.

For example, when the high frequency wave tuner module is formed by cutting circuit boards after the circuit boards formed by a plurality of circuit boards being continuously connected are covered with a plurality of shield covers which are continuously formed in a strip form, the position of the shield cover can be determined easily by forming the side walls of the individual shield covers facing one another which correspond to the end surface of the individual circuit boards which are continuously formed so as to be higher. Therefore, the same effect can be obtained efficiently.

Preferably, the circuit board has the approximately rectangular shape without notches formed on the end surfaces.

There is no need to carry out a process of perforating holes in the original hard ceramic member board and a process of providing notches on the end surfaces of the circuit board because the circuit board can be formed in a square shape only by merely cutting the original board. Therefore, the high frequency wave tuner module can be manufactured very easily without increasing the number of operation process. Thus, the same effect can be obtained efficiently because the productivity can be greatly improved.

The entire disclosure of Japanese Patent Application No. 2007-013471 filed on Jan. 24, 2007 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A high frequency wave tuner module, comprising:
a circuit board having an approximately rectangular shape, which is made of ceramic material; and
a shield cover to shield an interfering wave by covering a circuit part mounted on a board surface of the circuit board,
wherein the shield cover is formed by bending a metallic thin plate into a case shape,
wherein the shield cover includes four corner part side walls which contact the circuit board at four corner positions of the circuit board and four edge part side walls which extend in a thickness direction of the circuit board, and
wherein a position of the shield cover in a height direction with respect to the board surface is determined by the four corner part side walls of the shield cover contacting the board surface at the four corner positions of the circuit board, and a position of the shield cover on the board surface with respect to the circuit board is determined by engaging (i) the four edge part side walls of the shield cover which extend in the thickness direction of the circuit board, with (ii) end surfaces of the circuit board which correspond to the four edge part side walls, such that the four edge part side walls contact the end surfaces of the circuit board only from beside the circuit board.

2. The high frequency wave tuner module as claimed in claim 1, wherein the approximately rectangular shape of the circuit board does not include notches formed on the end surfaces of the circuit board.

* * * * *